| (12) | United States Patent | (10) Patent No.: | US 10,323,773 B2 |
|---|---|---|---|
| | Deperraz | (45) Date of Patent: | Jun. 18, 2019 |

(54) ELECTROACTIVE MATERIAL FLUID CONTROL APPARATUS

(71) Applicant: FLUID AUTOMATION SYSTEMS S.A., Versoix (CH)

(72) Inventor: Nicolas Deperraz, Bons en Chablais (FR)

(73) Assignee: Fluid Automation Systems S.A., Versoix (CH)

( * ) Notice: Subject to any disclaimer, the term of this patent is extended or adjusted under 35 U.S.C. 154(b) by 214 days.

(21) Appl. No.: 15/316,375

(22) PCT Filed: Jun. 10, 2015

(86) PCT No.: PCT/EP2015/062903
§ 371 (c)(1),
(2) Date: Dec. 5, 2016

(87) PCT Pub. No.: WO2015/189252
PCT Pub. Date: Dec. 17, 2015

(65) Prior Publication Data
US 2018/0149288 A1    May 31, 2018

(30) Foreign Application Priority Data
Jun. 10, 2014   (FR) .................................... 14 55241

(51) Int. Cl.
*F16K 31/02*    (2006.01)
*F16K 99/00*    (2006.01)
(Continued)

(52) U.S. Cl.
CPC ...... *F16K 99/0049* (2013.01); *B81C 1/00182* (2013.01); *F16K 31/02* (2013.01); *B81B 7/02* (2013.01); *F16K 2099/008* (2013.01)

(58) Field of Classification Search
CPC ................. F16K 99/0049; F16K 31/02; F16K 2099/008; B81C 1/00182; B81B 7/02
(Continued)

(56) References Cited

U.S. PATENT DOCUMENTS 4,842,017 A * 6/1989 Reynolds ................ F02C 7/232
251/129.06
5,029,805 A * 7/1991 Albarda ............... B41J 2/17596
251/11
(Continued)

*Primary Examiner* — John Bastianelli
(74) *Attorney, Agent, or Firm* — The Ollila Law Group LLC

(57) ABSTRACT

An electroactive material fluid control apparatus (100) is provided. The electroactive material fluid control apparatus (100) comprises a layered assembly (110) comprised of a dielectric layer (120) disposed between a first plate (130) and a second plate (140). The electroactive material fluid control apparatus (100) also includes a first fluid port (130*a*, 130*b*) formed in an outer surface of the layered assembly (110), and at least one fluid control device (200, 300, 400, 500) comprised of an electrode (212-512) disposed between the first plate (130) and a dielectric deformable material (214-514), wherein the electrode (212-512) is attached to the dielectric deformable material (214-514). The at least one fluid control device (200, 300, 400, 500) is fluidly coupled to the first fluid port (130*a*, 130*b*) via a fluid path (127, 128) in the dielectric layer (120) and the electrode (212-512) is coupled to a connector (150) that extends away from the layered assembly (110) in a direction parallel to the dielectric layer (120).

18 Claims, 13 Drawing Sheets

(51) Int. Cl.
*B81C 1/00* (2006.01)
*B81B 7/02* (2006.01)

(58) Field of Classification Search
USPC .................................................. 251/129.06
See application file for complete search history.

(56) References Cited

U.S. PATENT DOCUMENTS

| | | | | |
|---|---|---|---|---|
| 5,161,774 A | * | 11/1992 | Engelsdorf | F15C 5/00 251/11 |
| 5,216,273 A | | 6/1993 | Doering et al. | |
| 5,267,589 A | * | 12/1993 | Watanabe | B60G 17/01941 251/129.06 |
| 5,323,999 A | * | 6/1994 | Bonne | F15B 13/0405 251/129.06 |
| 7,093,818 B2 | * | 8/2006 | Koeneman | F16K 11/074 251/207 |
| 7,168,680 B2 | * | 1/2007 | Koeneman | F15C 5/00 251/129.06 |
| 8,272,392 B2 | * | 9/2012 | Pattekar | B01L 3/502738 251/129.06 |
| 2006/0017030 A1 | | 1/2006 | Koeneman | |
| 2008/0280112 A1 | | 11/2008 | Langereis et al. | |

* cited by examiner

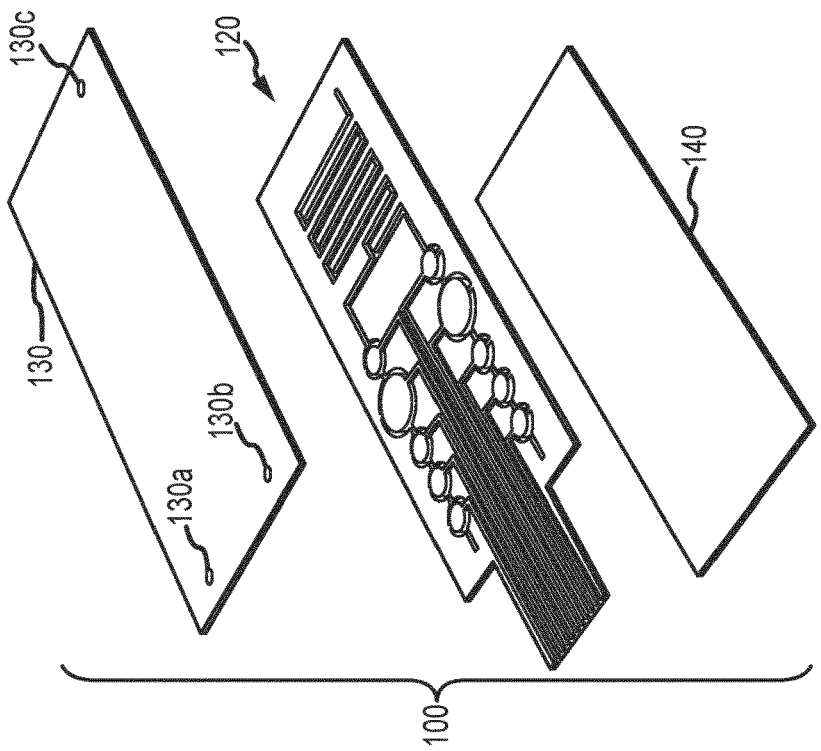
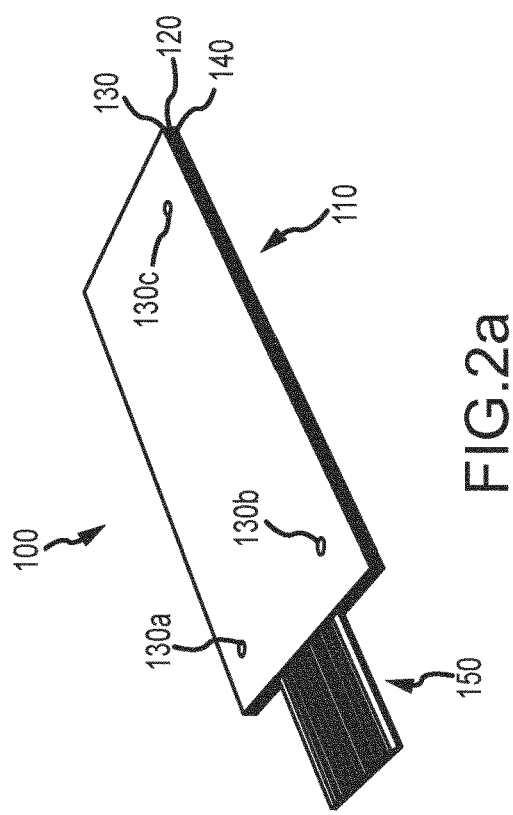
FIG.2b
FIG.2a

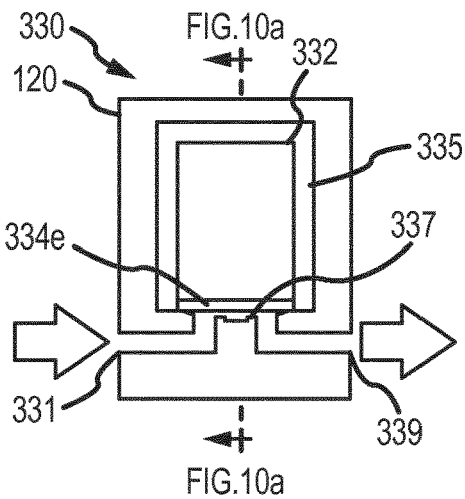
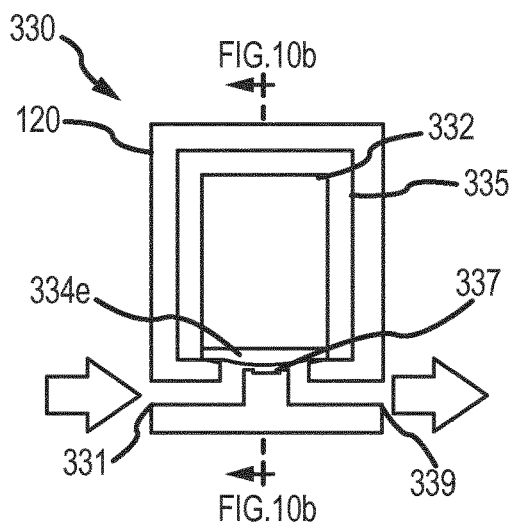
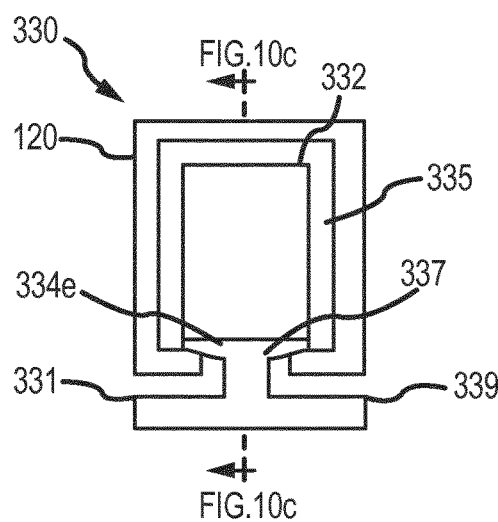

ELECTROACTIVE MATERIAL FLUID CONTROL APPARATUS

TECHNICAL FIELD

The embodiments described below relate to fluid control systems and, more particularly, to an electroactive material fluid control apparatus.

BACKGROUND

Electroactive materials are a recently developed technology that is sometimes used as a transducer that converts electrical energy to mechanical work. Electroactive materials have advantages over other materials used in transducers. For example, electroactive materials are elastically deformable and can therefore dampen vibrations. As a result, devices using electroactive materials generate less noise. Electroactive materials are also less dense than, for example, steel. Components fabricated with electroactive materials can therefore be lighter than comparable components fabricated with steel. The electroactive materials can also be less expensive and easier to manufacture than other materials. Electroactive materials can be fabricated in a variety of form factors and easily scaled in manufacturing. These and other advantages have driven the recent development of electroactive materials, such as devices that actuate.

Devices 10 using electroactive material can be arranged with, for example, dielectric deformable material 12 between two electrodes 14 as shown in FIG. 1a. A voltage 15 can be applied to the two electrodes 14 to cause the dielectric deformable material 12 to contract. This causes the distance between the electrodes 14 to decrease. This decrease in distance is shown in FIG. 1b. Using this principle, dielectric deformable materials have been used to replace components in fluid control devices. For example, stack actuators were developed that can replace a cam-spring system. The stack actuator can be comprised of partial ring electrodes that are stacked intermittently with discs of dielectric deformable material. The stack actuator can be coupled to and displace a valve member in a poppet valve rather than the cam-spring system.

Electroactive materials have also been used to form other fluid control devices. However, such devices are not part of a fluid control system that is suited for scalability required by many industrial applications. For example, the fluid control devices may not be assembled in a modular manner with other fluid control devices to increase the available fluid processing capacity. The designs of these devices are also narrowly tailored for specific applications which limit the available market. The designs can also require complex assembly processes or multiple different components that are not well suited to be modified for particular fluid control functions. For example, a design for a prior art valve might not be easily modified into a pump design. This can increase the design costs. With respect to manufacturing, complex and prototypical designs utilizing the electroactive materials typically have high manufacturing costs and low reliability that are unsuited for large scale manufacturing. In other words, prior art fluid control device designs have not fully exploited the advantages of available with electroactive materials.

Accordingly, there is a need for an electroactive material fluid control apparatus that is scalable, inexpensive, and reliable.

SUMMARY

An electroactive material fluid control apparatus is provided. According to an embodiment, the electroactive material fluid control apparatus comprises a layered assembly comprised of an dielectric layer disposed between a first plate and a second plate, a first fluid port formed in an outer surface of the layered assembly, and at least one fluid control device comprised of an electrode disposed between the first plate and a dielectric deformable material, wherein the electrode is attached to the dielectric deformable material, wherein the at least one fluid control device is fluidly coupled to the first fluid port via a fluid path in the dielectric layer and the electrode is coupled to a connector that extends away from the layered assembly in a direction parallel to the dielectric layer.

A method of forming an electroactive material fluid control apparatus is provided. According to an embodiment, the method comprises forming a layered assembly comprised of forming and disposing the dielectric layer between the first plate and the second plate, forming a first fluid port in an outer surface of the layered assembly, forming at least one fluid control device comprised of forming and disposing an electrode between the first plate and the dielectric deformable material, and attaching the electrode to the dielectric deformable material. The method further comprises forming a fluid path in the dielectric layer, forming a connector that extends away from the layered assembly in a direction parallel to the dielectric layer, and fluidly coupling the fluid control device to the first fluid port via the fluid path in the dielectric layer and coupling the electrode to the connector.

A method of controlling a fluid flow in an electroactive material fluid control apparatus is provided. According to an embodiment, the method comprises providing a layered assembly comprised of an dielectric layer disposed between a first plate and a second plate, providing a first fluid port formed in an outer surface of the layered assembly, providing a connector that extends away from the layered assembly in a direction parallel to the dielectric layer, wherein the connector is coupled to an electrode in the dielectric layer. The method further comprises flowing the fluid between the first fluid port and one or more fluid control devices via a fluid path in the dielectric layer by applying a voltage to the electrode with the connector.

ASPECTS

According to an aspect, an electroactive material fluid control apparatus (100) comprises a layered assembly (110) comprised of an dielectric layer (120) disposed between a first plate (130) and a second plate (140), a first fluid port (130a, 130b) formed in an outer surface of the layered assembly (110), and at least one fluid control device (200, 300, 400, 500) comprised of an electrode (212-512) disposed between the first plate (130) and a dielectric deformable material (214-514), wherein the electrode (212-512) is attached to the dielectric deformable material (214-514), wherein the at least one fluid control device (200, 300, 400, 500) is fluidly coupled to the first fluid port (130a, 130b) via a fluid path (127, 128) in the dielectric layer (120) and the electrode (212-512) is coupled to a connector (150) that extends away from the layered assembly (110) in a direction parallel to the dielectric layer (120).

Preferably, the electroactive material fluid control apparatus (100) further comprises a second fluid port (130c) formed in an outer surface of the layered assembly (110), the second fluid port (130c) fluidly coupled to the at least one fluid control device (200, 300, 400, 500).

Preferably, the electroactive material fluid control apparatus (100) further comprises a second fluid control device (200, 300, 400, 500) in the dielectric layer (120) and fluidly coupled to the first fluid control device (200, 300, 400, 500) via the fluid path (127, 128).

Preferably, the fluid path (127, 128) is formed by the first plate (130), the dielectric layer (120), and the second plate (140).

Preferably, a second electrode (212-512) is between the dielectric deformable material (214-514) and the second plate (140), wherein the fluid control device (200, 300, 500) is comprised of a selectively formed channel (238, 338, 518b) formed by the dielectric layer (120), the first plate (130), and the second plate (140) when the first and the second electrodes (212-512) displace away from the first and the second plates (130, 140).

Preferably, the fluid control device (200, 500) is comprised of a selectively formed channel (238, 518a) that is opened when the electrode (232, 532) is displaced away from the first or the second plate (130, 140).

Preferably, the fluid control device (300, 500) is comprised of a selectively formed channel (338, 518) that is closed when dielectric deformable material (334, 534) presses against an adjacent surface (337, 517) in the dielectric layer (120).

Preferably, the fluid control device (500) is comprised of at least two selectively formed channels (518a, 518b).

Preferably, the at least two selectively formed channels (518a, 518b) are comprised of a first selectively formed channel (518a) that is opened when an electrode (512) is displaced away from the first or the second plate (130, 140), and a second selectively formed channel (518b) that is closed when dielectric deformable material (514) presses against an adjacent surface (517).

Preferably, the fluid control device (200) is a valve (230) and the dielectric deformable material (234) extends from the first plate (130) to the second plate (140) to close the valve (230) when the electrode (232) is not energized, and displaces away from the first plate (130) or the second plate (140) to open the valve (230) when the electrode (232) is energized.

Preferably, the fluid control device (300) is a valve (330) is comprised of a casing (335) partially surrounding the dielectric deformable material (334), an extending portion (334e) of the dielectric deformable material (334), and a selectively formed channel (338) between the extending portion (334e) and an adjacent surface (337) of the dielectric layer (120).

Preferably, the fluid control device (200) is a valve (230) comprised of a valve chamber (236a,b) partially surrounding the dielectric deformable material (234).

Preferably, the fluid control device (200, 300, 400) is further comprised of a second electrode (212-432) disposed between the dielectric deformable material (214-434) and the second plate (140), wherein the second electrode (212-432) is attached to the dielectric deformable material (214-434).

Preferably, the first fluid port (130a, 130b) extends through the first plate (130) to the fluid path (127, 128) in the dielectric layer (120).

Preferably, further comprising a second fluid port (130c) fluidly coupled to the first fluid port (130a, 130b) via the fluid path (127, 128) in the dielectric layer (120).

Preferably, the electrode (212-432) is attached to a plate (130, 140).

According to an aspect, a method of forming an electroactive material fluid control apparatus (100) comprises forming a layered assembly (110) comprised of forming and disposing the dielectric layer (120) between the first plate (130) and the second plate (140), forming a first fluid port (130a, 130b) in an outer surface of the layered assembly (110), forming at least one fluid control device (200, 300, 400, 500) comprised of forming and disposing an electrode (212-512) between the first plate (130) and the dielectric deformable material (214-514), and attaching the electrode (212-512) to the dielectric deformable material (214-514), forming a fluid path (127, 128) in the dielectric layer (120), forming a connector (150) that extends away from the layered assembly (110) in a direction parallel to the dielectric layer (120), and fluidly coupling the fluid control device (200, 300, 400, 500) to the first fluid port (130a,b) via the fluid path (127, 128) in the dielectric layer (120) and coupling the electrode (212-512) to the connector (150).

Preferably, the method further comprises forming a second fluid port (130c) in an outer surface of the layered assembly (110) and coupling the second fluid port (130c) to the at least one fluid control device (200, 300, 400, 500).

Preferably, the method further comprises forming a second fluid control device (200, 300, 400, 500) in the dielectric layer (120) and fluidly coupling the second fluid control device (200, 300, 400, 500) to the first fluid control device (200, 300, 400, 500) via the fluid path (127, 128).

Preferably, the method further comprises forming the fluid path (127, 128) with the first plate (130), the dielectric layer (120), and the second plate (140).

Preferably, the fluid control device (200, 300, 500) comprises of a selectively formed channel (238, 338, 518b) formed by the dielectric layer (120), the first plate (130), and the second plate (140).

Preferably, the method further comprises opening a selectively formed channel (238, 518a) in the fluid control device (200, 500) by displacing the electrode (232, 512) away from the first or the second plate (130, 140).

Preferably, the method further comprises forming a selectively formed channel (338) in the fluid control device (300) that closes when dielectric deformable material (334) presses against an adjacent surface (337) in the dielectric layer (120).

Preferably, the method further comprises forming at least two selectively formed channels (518a, 518b).

Preferably, the method further comprises forming a first selectively formed channel (518a) that is opened when the electrode (512) is displaced away from the first or the second plate (130, 140), and forming a second selectively formed channel (518b) that is closed when the dielectric deformable material (514) presses against an adjacent surface (517).

Preferably, the method further comprises forming a valve (230) in the fluid control devices (200) with dielectric deformable material (234), the valve (230) extending from the first plate (130) to the second plate (140) to close the valve (230) when the electrode (232) is not energized, and displacing away from the first plate (130) or the second plate (140) to open the valve (230) when the electrode (232) is energized.

Preferably, the method further comprises forming a valve (330) in the fluid control devices (300), the forming the valve (330) is comprised of forming a casing (335) partially surrounding the dielectric deformable material (334), forming an extending portion (334e) of the dielectric deformable material (334), and forming a selectively formed channel (338) between the extending portion (334e) and an adjacent surface (337) of the dielectric layer (120).

Preferably, the method is further comprised of forming the electroactive material fluid control apparatus (100), further comprised of forming a valve (230) by forming a valve chamber (236a,b) partially surrounding the dielectric deformable material (234).

Preferably, the method further comprises forming and disposing a second electrode (212-432) between the dielectric deformable material (214-434) and the second plate (140) and attaching the second electrode (212-432) to the dielectric deformable material (214-434).

Preferably, the method further comprises extending the first fluid port (130a, 130b) through the first plate (130) to fluid paths (127, 128) that are in the dielectric layer (120).

Preferably, the method further comprises forming and coupling a second fluid port (130c) to the first fluid port (130a, 130b) via the fluid path (127, 128) in the dielectric layer (120).

Preferably, the electrode (212-432) is attached to the first plate (130) or the second plate (140).

According to an aspect, a method of controlling a fluid flow in an electroactive material fluid control apparatus (100) comprises providing a layered assembly (110) comprised of an dielectric layer (120) disposed between a first plate (130) and a second plate (140), providing a first fluid port (130a, 130b) formed in an outer surface of the layered assembly (110), providing a connector (150) that extends away from the layered assembly (110) in a direction parallel to the dielectric layer (120), wherein the connector (150) is coupled to an electrode (212-512) in the dielectric layer (120), and flowing the fluid between the first fluid port (130a, 130b) and one or more fluid control devices (200, 300, 400, 500) via a fluid path (127, 128) in the dielectric layer (120) by applying a voltage to the electrode (212-512) with the connector (150).

Preferably, the method further comprises providing a selectively formed channel (238, 338) in the fluid path (127, 128) and closing the selectively formed channel (238, 338) by displacing dielectric deformable material (314, 324, 334, 514) in the dielectric layer (120) towards an adjacent surface (317, 327, 337).

Preferably, the method further comprises providing a selectively formed channel (418, 518a) in the fluid path (127, 128) and opening the selectively formed channel (418, 518a) by displacing the electrode (212-432) away from one of the plates (130, 140).

Preferably, the method further comprises providing first selectively formed channel (518a) and a second selectively formed channel (518b) that are in the fluid path (127, 128), opening a first selectively formed channel (518a) by displacing the electrode (512a) away from one of the plates (130, 140), and closing a second selectively formed channel (518b) by extending the dielectric deformable material (514) towards an adjacent surface (517).

BRIEF DESCRIPTION OF THE DRAWINGS

The same reference number represents the same element on all drawings. It should be understood that the drawings are not necessarily to scale.

FIG. 2a shows a perspective view of the electroactive material fluid control apparatus 100 according to an embodiment.

FIG. 2b shows an exploded perspective view of the electroactive material fluid control apparatus 100.

FIGS. 9a-9c show top plan views of the valve 330.

DETAILED DESCRIPTION

Figure 1A:
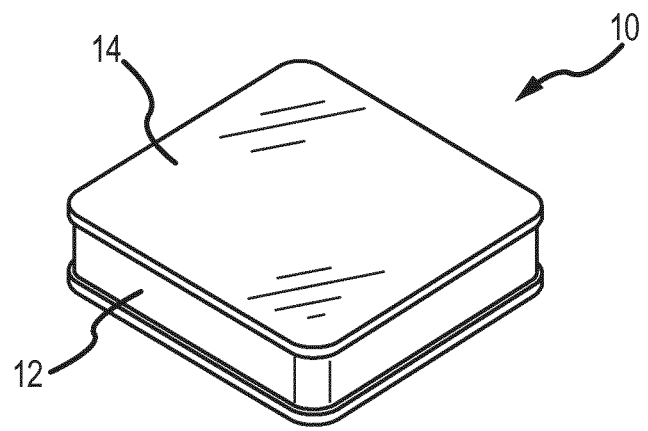
FIGS. 1a-1b show devices utilizing electroactive materials 10 can be arranged with dielectric deformable material 12 between two electrodes 14.
Figure 1B:
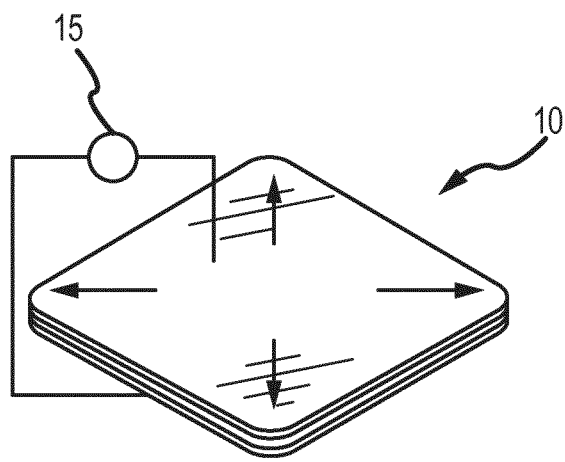

FIGS. 2a-14 and the following description depict specific examples to teach those skilled in the art how to make and use the best mode of embodiments of an electroactive material fluid control apparatus. For the purpose of teaching inventive principles, some conventional aspects have been simplified or omitted. Those skilled in the art will appreciate variations from these examples that fall within the scope of the present description. Those skilled in the art will appreciate that the features described below can be combined in various ways to form multiple variations of the electroactive material fluid control apparatus. As a result, the embodiments described below are not limited to the specific examples described below, but only by the claims and their equivalents.

FIG. 2a shows a perspective view of the electroactive material fluid control apparatus 100 according to an embodiment. As shown, the fluid control apparatus 100 includes a layered assembly 110 comprised of a dielectric layer 120 disposed between a first plate 130 and a second plate 140. The fluid control apparatus 100 includes fluid ports 130a-c. The fluid ports 130a-c are formed in the outer surface of the layered assembly 110. The fluid ports 130a-c can be coupled to other equipment or one or more electroactive material fluid control apparatus 100. For example, either of the first fluid ports 130a,b can receive a fluid from a fluid supply. The second fluid port 130c can provide processed (e.g., mixed) fluid to the equipment. The fluid control apparatus 100 is also shown with a connector 150 that is adapted to electrically couple to a controller. Accordingly, the controller can regulate or control the fluid flowing through the electroactive material fluid control apparatus 100.

FIG. 2b shows an exploded perspective view of the electroactive material fluid control apparatus 100. The layered assembly 110 is shown with the first plate 130 and the second plate 140. The plates 130, 140 can be comprised of glass although any suitable material can be employed. In the embodiment shown, the plates 130, 140 have flat surfaces without some features such as grooves, additional components, or the like. However, in alternative embodiments, the plates 130, 140 can have grooves and, for example, electrical components. The first plate 130 is shown with the fluid ports 130a-c extending through the first plate 130 in a substantially perpendicular orientation although alternative arrangements can be employed. The fluid ports 130a-c fluidly couple the dielectric layer 120 to equipment or another fluid control apparatus 100. The dielectric layer 120 is described in following with reference to FIGS. 3-13.

Figure 3:
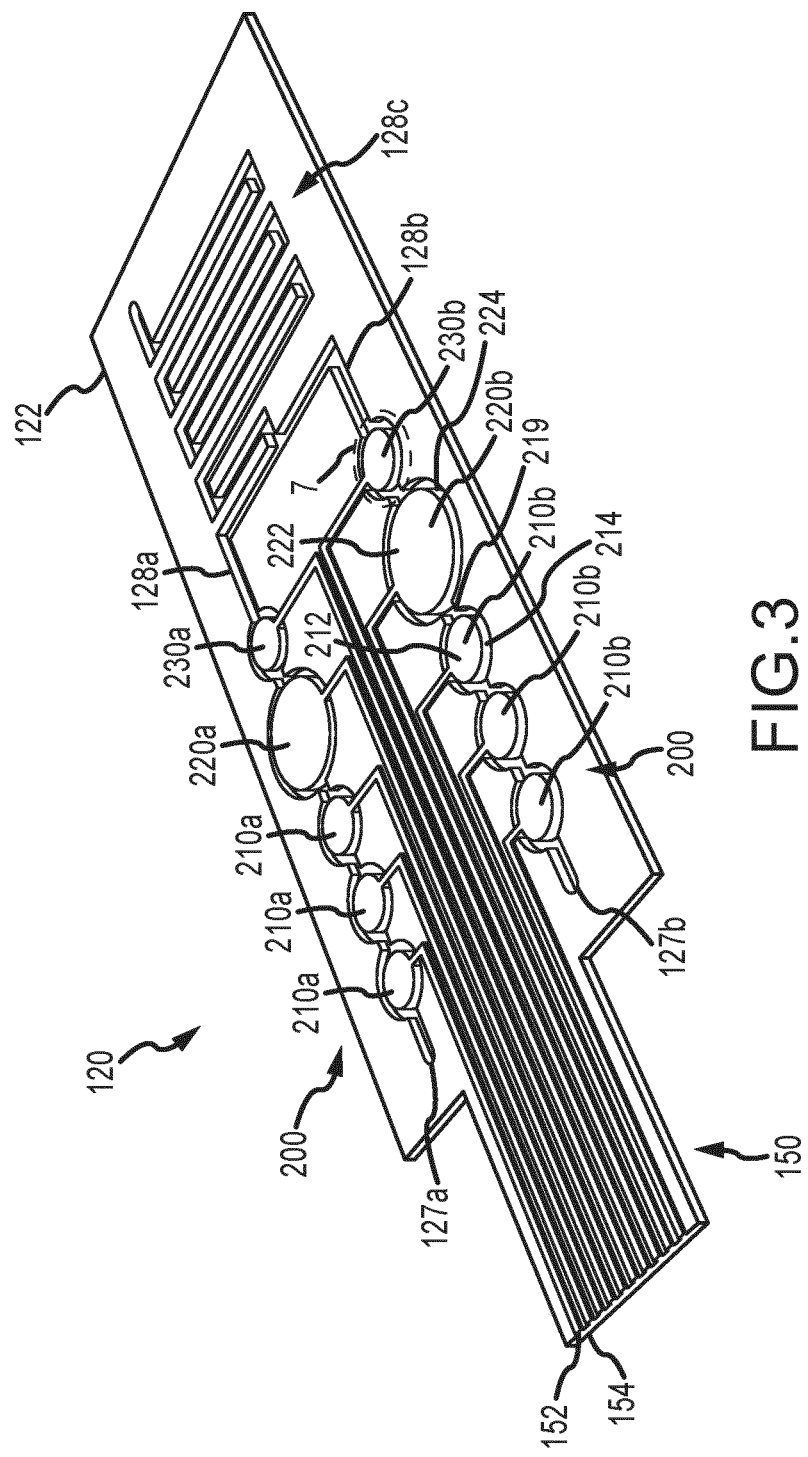
FIG. 3 shows a perspective view of the dielectric layer 120 according to an embodiment.

FIG. 3 shows a perspective view of the dielectric layer 120 according to an embodiment. The dielectric layer 120 includes a substrate 122 with conductors 152, 154 that are attached to the outer surfaces of the substrate 122. The first conductor 152 is disposed between the dielectric layer 120 and the first plate 130 and the second conductor 154 is disposed between the dielectric layer 120 and the second plate 140. As will be explained in more detail in the following, the conductors 152, 154 can be coupled to electrodes on fluid control devices 200. The dielectric layer 120 also includes fluid paths 127a,b and 128a-c. Fluid control devices 200 are arranged in series in each of the fluid paths 127a,b. The fluid control devices 200 in each fluid paths 127a,b can include pumps 210a,b, a reservoir 220a,b, and a valve 230a,b, although any suitable combination or arrangements of the fluid control devices 200 can be employed.

The fluid paths 128a-c are comprised of a first fluid path 128a and a second fluid path 128b that are coupled to a mixer 128c. The fluid paths 128a,b receive fluid from the fluid control devices 200a,b and convey the fluid to the mixer 128c. The mixer 128c has an alternating structure. The alternating structure aids in mixing the fluid from the fluid path 128a with the fluid from the fluid path 128b. The mixer 128c can mix these two components into a fluid mixture along the length of the alternating structure. In other embodiments, the mixer 128c can be comprised of any appropriate shapes or structure. The dielectric layer 120 can control the flow of the fluid from the first fluid port 130a,b to the second port 130c.

The substrate 122 is comprised of electroactive material to control the flow of the fluid although any suitable material or combination of materials may be employed. For example, portions of the substrate 122 can include materials that do not respond to electric fields in the conductors 152, 154. In the embodiment shown, the substrate 122 is comprised of dielectric deformable material although any suitable material can be employed. Accordingly, portions of the substrate 122 that are exposed to an electric field from the electrodes 232 can contract in a direction that is perpendicular to the plane formed by the substrate 122. In the portion that is contracting, the volume can remain constant. Accordingly, displacement of the dielectric deformable material 234 in the direction perpendicular to the electrodes 232 can cause a displacement that is parallel to the electrodes. However, in some dielectric deformable materials, the electrodes can displace perpendicularly without a proportional displacement in the direction parallel to the electrodes. In addition, the substrate 122 can form electric fields when strained by a force or pressure. For example, dielectric deformable material strained in a direction horizontal to the electrodes can form a voltage on the electrodes that is proportional to the horizontal strain. These properties of the dielectric deformable material can be employed in the fluid control devices 200, such as the pumps 210a,b.

The pumps 210a,b are shown as linearly arranged peristaltic pumps. The pumps 210a,b can actuate in a sequence to pump the fluid from the first fluid ports 130a,b to the second port 130c. For example, the pumps 210a,b that are proximate the reservoirs 220b can remain closed while the pumps 210a,b that are proximate the first fluid ports 130a,b actuate to draw fluid from the first fluid ports 130a,b. Subsequently, the pumps 210a,b proximate the reservoirs 220a,b can open while the pumps 210a,b that are proximate the fluid paths 127a,b closes to push the fluid towards the reservoirs 220a,b. Once the pumps 210a,b proximate the first ports 130a,b are closed, the other pumps 210a,b can de-actuate to force the remaining fluid into the reservoirs 220a,b. Accordingly, the pumps 210a,b can be peristaltic pumps. The pumping can change the fluid pressure in the reservoirs 220a,b.

Figure 4:
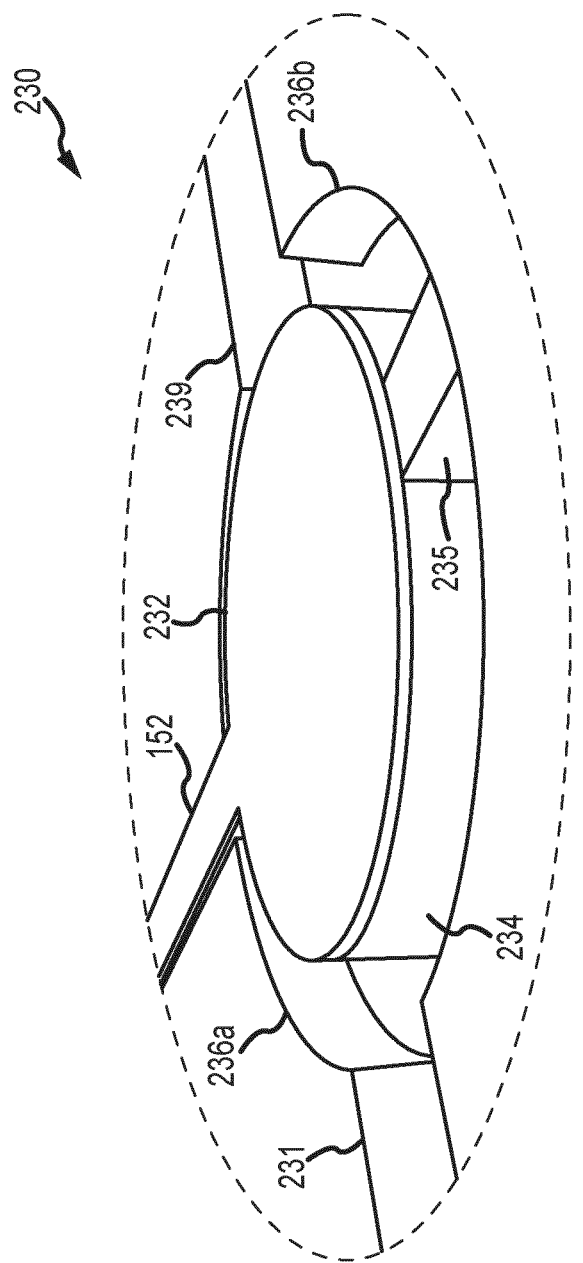
FIG. 4 shows an enlarged perspective view of the valve 230 according to an embodiment.

FIG. 4 shows the valve 230 according to an embodiment. The valve 230 includes an electrode 232 that is attached to a dielectric deformable material 234. The conductors 152 are coupled to the electrode 232. Partially surrounding the dielectric deformable material 234 are valve chambers 236a,b. The valve chambers 236a,b are separated by the dielectric deformable material 234 and a barrier 235 that extends across the valves 230. A first fluid opening 231 is fluidly coupled to the first valve chamber 236a and a second fluid opening 239 is fluidly coupled to the second valve chamber 236b. As can be seen, the fluid openings 231, 239 are in the dielectric layer 120. The fluid openings 231, 239 are fluidly coupled to the fluid paths 127, 128. The operation of the valve 230 is described with reference to FIGS. 5a-6b.

Figure 5A:
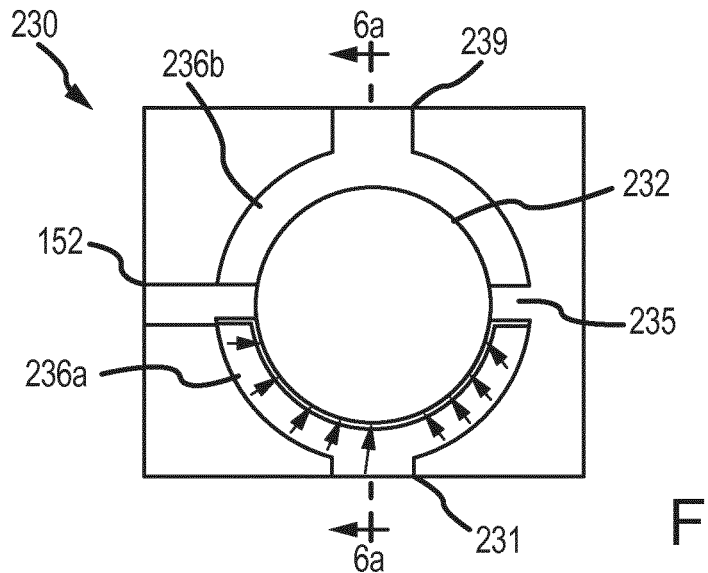
FIGS. 5a-5b show top plan views of the valves 230.
Figure 5B:
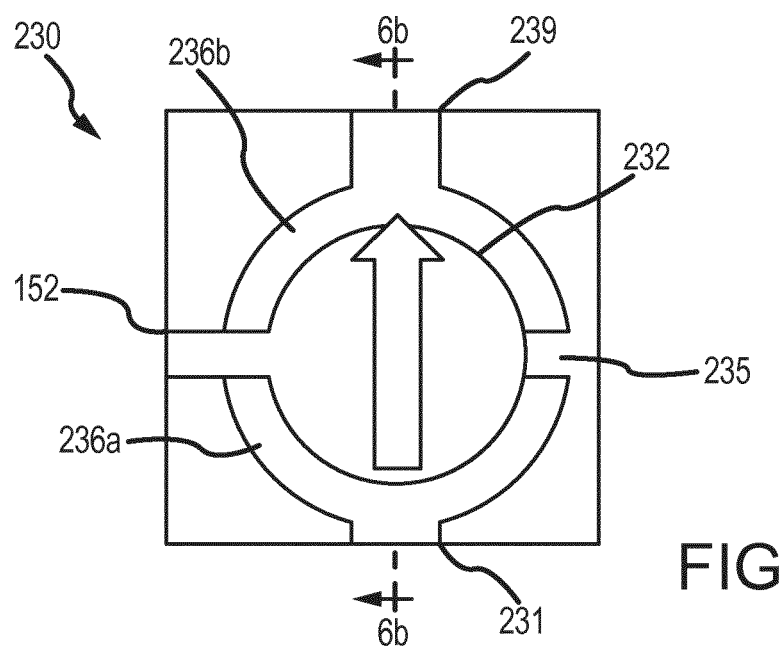

FIGS. 5a-5b show top plan views of the valves 230. In FIG. 5a, the fluid is in the first valve chamber 236a and is not in the second valve chamber 236b. The fluid is prevented from flowing from the first valve chamber 236a to the second valve chamber 236b due to the dielectric deformable material 234 and the barrier 235. The pressure of the fluid pressing against the dielectric deformable material 234 and barrier 235 is shown by the arrows in FIG. 5a. In FIG. 5b, the fluid is in both the first valve chamber 236a and the second valve chamber 236b. The direction of the fluid flow is shown by the arrow in FIG. 5b. The fluid in the first valve chamber 236a can be fluidly coupled to the second valve chamber 236b when a voltage is applied to the electrodes 232 as described in the following with reference to FIGS. 6a-6b.

Figure 6A:
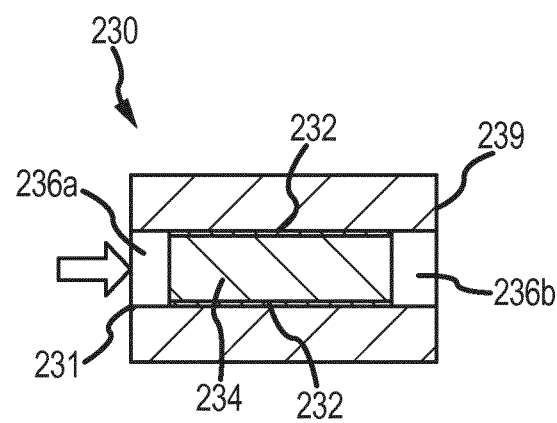
FIGS. 6a-6b show side plan views of the valve 230.
Figure 6B:
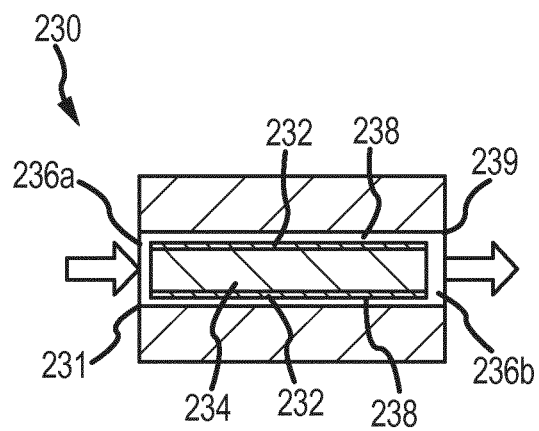

FIGS. 6a-6b show side plan views of the valve 230 taken at 6a-6a and 6b-6b in FIGS. 5a and 5b. The valve 230 is shown in FIG. 6a where the dielectric deformable material 234 extends from the first plate 130 to the second plate 140. Between the plates 130 and the dielectric deformable material 234 are the electrodes 232. The dielectric deformable material 234 can press against the plates 130, 140 via the electrodes 232. The fluid pressure at the first fluid opening 231 is shown by the arrow proximate the first fluid opening. As can be seen, the dielectric deformable material 234 and the barrier 235 (described with reference to FIGS. 5a-5b) as well as the electrodes 232 prevent the fluid from flowing from the first fluid opening 231 to the second fluid opening 239.

When the voltage is applied to the electrodes 232, the dielectric deformable material 234 contracts. The contraction of the dielectric deformable material 234 displaces the electrodes 232 away from the plates 130, 140. Selectively formed channels 238 are formed by the plates 130, 140 and the electrodes 232 by the displacement of the electrodes 232. The distance of the displacement of the electrodes 232 from the plates 130, 140 can be proportional to the voltages on the electrodes 232. For example, in the embodiment shown, the two electrodes 232 can, respectively, have a positive voltage and a negative voltage. This can form an electric field that traverses the dielectric deformable material 234. The dielectric deformable material 234 can displace in proportion to the difference in voltage between the electrodes 232. The valves 230 can therefore regulate the flow of the fluid by regulating the voltage difference between the electrodes 232. The selectively formed channels 238 fluidly couple the first fluid opening 231 and the second fluid opening 239. The flow of the fluid from the first fluid opening 231 to the second fluid opening 239 is shown by the arrows in FIG. 6b.

In addition to the embodiments described in the foregoing, the dielectric layer 120 can include alternative fluid control devices. Exemplary embodiments are described in the following with reference to FIGS. 7-10c.

Figure 7:
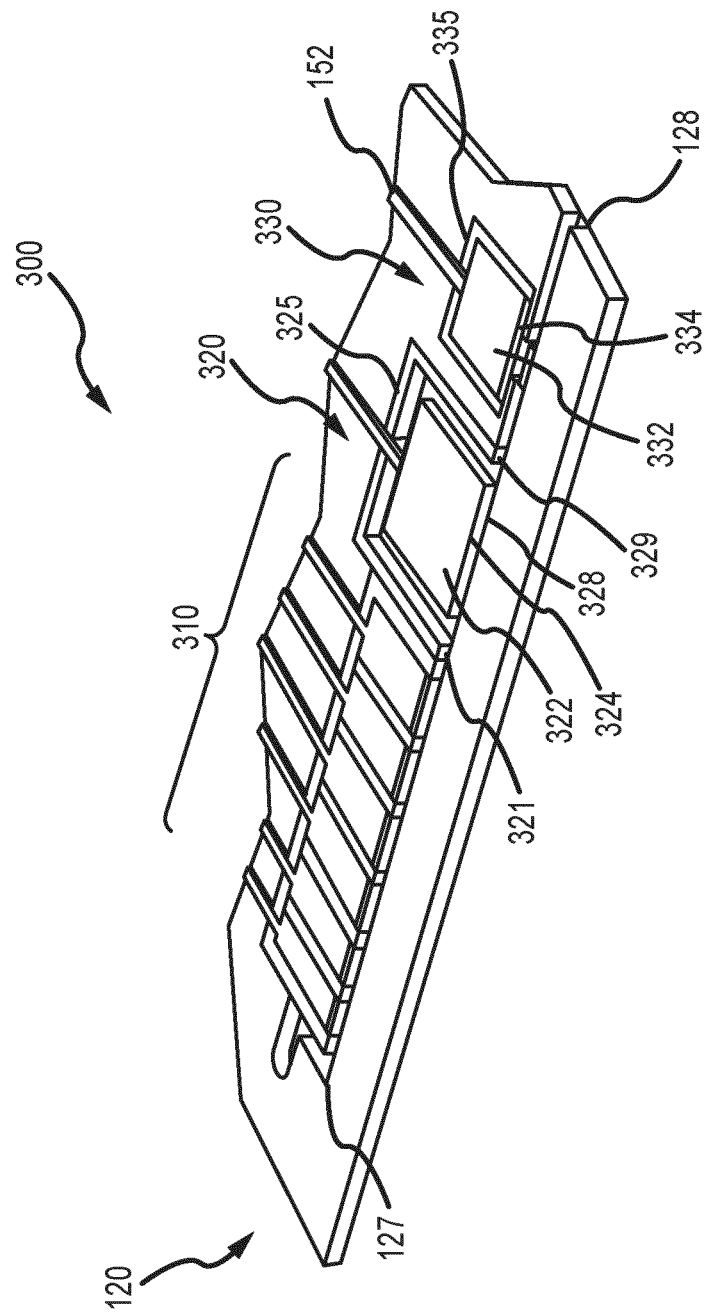
FIG. 7 shows a perspective view of the fluid control devices 300 according to another embodiment.

FIG. 7 shows a perspective view of the fluid control devices 300 according to another embodiment. One row of the fluid control devices 300 is shown for clarity. The fluid control devices 300 include pumps 310 that are linearly arranged between a reservoir 320 and the fluid path 127. The reservoir 320 is disposed next to a valve 330 along the fluid path 127. The reservoir 320 and a valve 330 include casings 315-335 that partially surround dielectric deformable material. For example, the reservoir 320 includes an electrode 322 that is attached to dielectric deformable material 324 partially surrounded by the casing 325. A first fluid opening 321 and a second fluid opening 329 are in the fluid paths 127a,b. The fluid can be between the dielectric deformable material 324 and the casing 325. The pressure of the fluid between the dielectric deformable material 324 and the casing 325 can induce a stress in the dielectric deformable material 324 which induces a voltage on the electrodes 322. The fluid control devices 300 also include the pumps 310 and the valve 330, which are described in more detail in the following.

Figure 8:
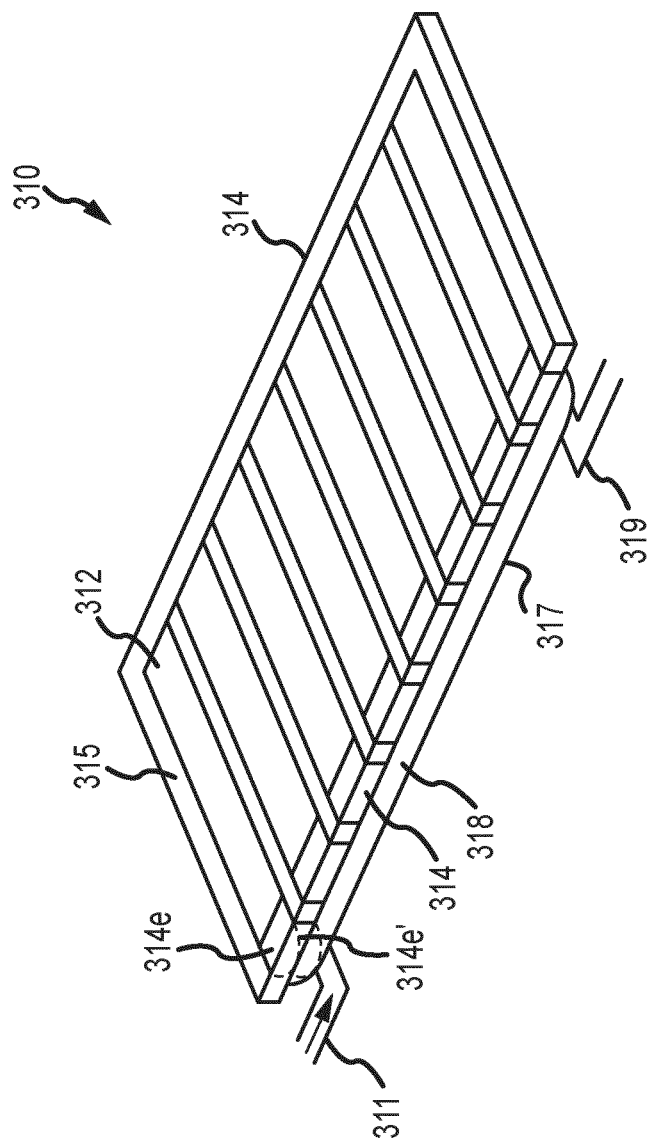
FIG. 8 shows a detailed perspective view of the pumps 310.

FIG. 8 shows a detailed perspective view of the pumps 310. The pumps 310 include a first fluid opening 311 and a second fluid opening 319. The pumps 310 also include electrodes 312 that are attached to dielectric deformable material 314. The dielectric deformable material 314 includes an extending portion 314e. The extending portion 314e is shown as not being covered by the electrodes 312. A casing 315 partially surrounds the dielectric deformable material 314. A selectively formed channel 318 is between the extending portions 314e and an adjacent surface 317 of the dielectric layer 120. Also shown is the extending portion 314e' extending into the selectively formed channel 318. The selectively formed channel 318 is fluidly coupled to the fluid openings 311, 319.

FIGS. 9a-9c show top plan views of the valve 330. The valve 330 has a first fluid opening 331 that is fluidly coupled to a second fluid opening 339. The valve 330 includes electrodes 332 that are attached to dielectric deformable material 334. The dielectric deformable material 334 has an extending portion 334e. A casing 335 partially surrounds the dielectric deformable material 334 so the extending portion 334e is free to displace towards an adjacent surface 337 when voltage is applied to the electrodes 332. The displacement of the extending portion 334e is described in more detail in the following with reference to FIGS. 10a-10c.

Figure 10A:
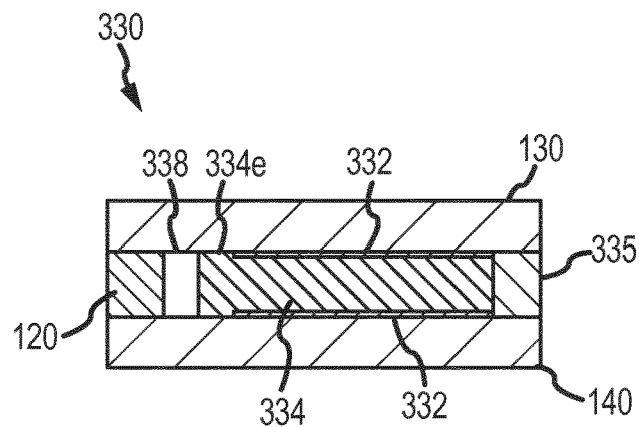
FIGS. 10a-10c show side plan views of the valve 330.
Figure 10B:
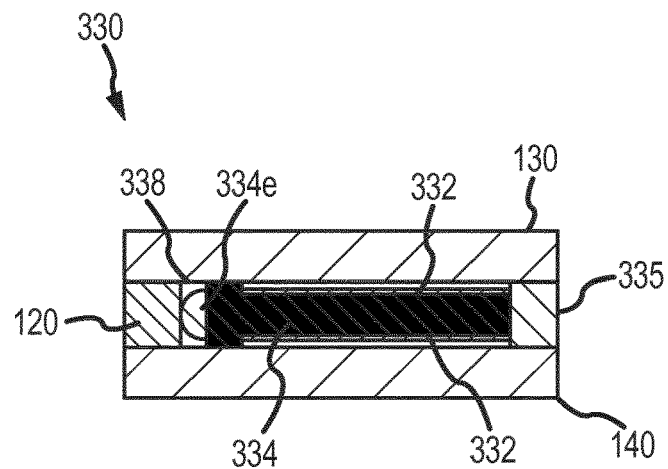
Figure 10C:
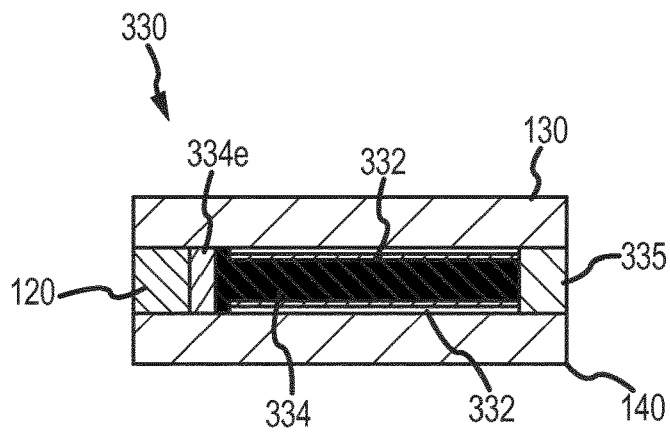

FIGS. 10a-10c show side plan views of the valve 330. As shown, the valve 330 includes a selectively formed channel 338 that is formed by the dielectric layer 120, the first plate 130, and the second plate 140. The dielectric deformable material 334 and the casing 335 are shown as part of the dielectric layer 120. Between the dielectric deformable material 334 and the plates 130, 140 are electrodes 332. The selectively formed channel 338 is shown as being between the dielectric layer 120 and the extending portion 334e.

With reference to FIGS. 7-10c, the fluid control devices 300 actuate when voltage is applied to the electrodes 312-332. When a voltage is applied to the electrodes 312-332, the dielectric deformable material 314-334 contracts in a direction perpendicular to the electrodes 312-332. The volume of the dielectric deformable material 314-334 may be substantially the same during the contraction. Accordingly, the contraction can cause the dielectric deformable material 314-334 to tend to extend equally in all directions parallel to the electrodes 312-332. The casings 315-335 prevent the dielectric deformable material 314-334 from extending in directions other than towards the adjacent surface 317-337. This causes the extending portion 314e-334e to extend towards the adjacent surface 317-337. The width of the selectively formed channels 318-338 can therefore decrease or increase. In alternative embodiments, the casings 315-335 may not be employed. For example, the dielectric deformable material 314-334 can be hardened instead of employing a casing that is comprised of a different material. Additionally or alternatively, the dielectric deformable material 314-334 may not be hardened, but may resist lateral displacement in directions other than towards the adjacent surface 317-337.

In the pumps 310, the width of the selectively formed channel 318 can vary according to the moving wave shape described with reference to FIG. 8. For example, the distance between the extending portion 314e and the adjacent surface 317 can be different for each extending portion 314e. The distances between the extending portions 314e and the adjacent surface 317 can vary according to the moving wave shape by actuating the electrodes 312 in a sequence. The sequence can be a peristaltic sequence that pumps fluid along the fluid paths 127, 128. The flow of the fluid through the fluid paths 127, 128 can be controlled by the valve 330.

In the valve 330, the decreased distance between the extending portion 334e and the adjacent surface 337 can reduce the fluid flow rate. As shown in FIG. 10b, the extending portion 334e has a round cross sectional shape. This can be due to elastic deformation of the dielectric deformable material 334 in the extending portion 334e. For example, the dielectric deformable material 334 can elastically deform similar to rubber. Although the extending portion 334e has the round cross sectional shape, any appropriate shape can be employed to limit the fluid flow. Since the selectively formed channel 338 is still partially open, the fluid can flow from the first fluid opening 331 to the second fluid opening 339 at a reduced rate.

When the voltage is further increased, the extending portion 334e can further extend to the position shown in FIG. 10c so as to press against the adjacent surface 337 and the plates 130, 140. The extending portion 334e, having elastic deformation, can conform to the shape of the adjacent surfaces 337 and the plates 130, 140. The conforming of the extending portion 334e provides a fluid seal that closes the selectively formed channel 338. Accordingly, the fluid is prevented from flowing between the first fluid opening 331 and the second fluid opening 339.

Alternative embodiments of the fluid control devices where the dielectric deformable material may not extend into the selectively formed channel are described in more detail in the following with reference to FIGS. 11-13.

Figure 11:
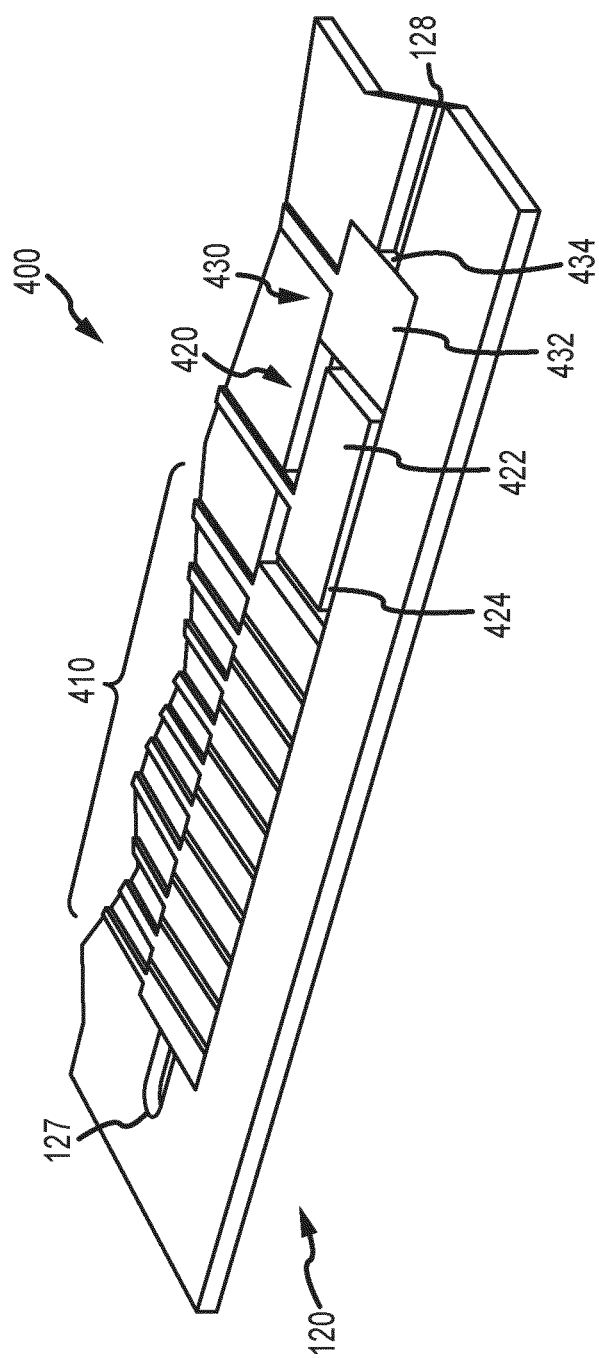
FIG. 11 shows a perspective view of fluid control devices 400 according to another embodiment.

FIG. 11 shows a perspective view of fluid control devices 400 according to another embodiment. The fluid control devices 400 include pumps 410 that are linearly arranged between the fluid path 127 and the reservoir 420. The fluid control devices 400 are fluidly coupled to the fluid paths 127, 128. Similar to those described with reference to FIGS. 7-10c, the fluid control devices 400 are rectangular shaped. However, the fluid control devices 400 do not include casings. In addition, a selectively formed channel is formed between the electrodes 412 and the plates 130, 140. For example, a valve 430 can displace away from the plates 130, 140 to form a selectively formed channel to fluidly couple the reservoir 420 with the fluid path 128. The pumps 410 can displace away from the plates 130, 140 in a sequence to pump the fluid to the reservoir 420.

Figure 12:
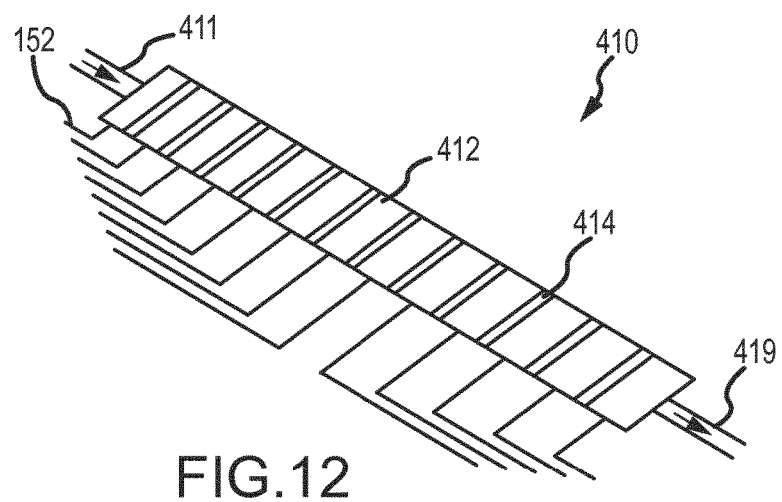
FIG. 12 shows a perspective view of pumps 410 according to another embodiment.

FIG. 12 shows a perspective view of pumps 410 according to another embodiment. The pumps 410 include a first fluid opening 411 and a second fluid opening 419. The pumps 410 also include electrodes 412 that are attached to dielectric deformable materials 414. The conductors 152 are coupled to the electrodes 412. The dielectric deformable material 414 is also disposed between the electrodes 412. For example, there is a section of dielectric deformable material 414 between each electrode 412. The width of the section can be determined from various factors such as the dielectric breakdown strength of the dielectric deformable material 414.

Figure 13:
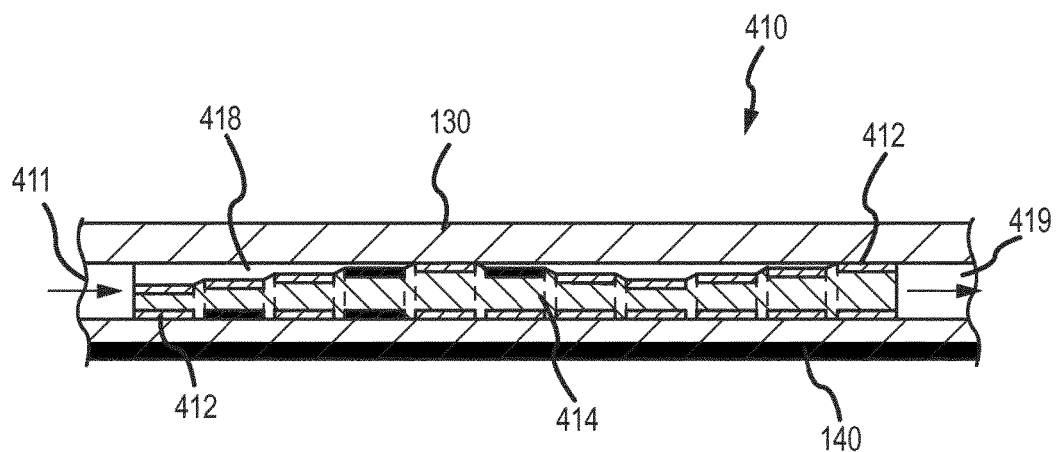
FIG. 13 shows a side plan view of the pumps 410.

FIG. 13 shows a side plan view of the pumps 410. The pumps 410 are shown as disposed between the plates 130, 140. A selectively formed channel 418 is formed between the electrodes 412 and the first plate 130. The selectively formed channel 418 includes portions that have different distances between the electrodes 412 and the first plate 130. The second plate 140 is attached to the electrodes 412 that are proximate the second plate 140. As can be seen, the selectively formed channel 418 is formed by the first plate 130, the electrode 412, and the dielectric deformable material 414. The electrodes 412 attached to the second plate 140 do not displace away from the second plate 140. The selectively formed channel 418 also has a moving wave shape.

The moving wave shape is formed by the electrodes 412 displacing away from the plates 130, 140 in a sequence. For example, the conductors 152 can apply a voltage to the electrodes 412 in a sequence that is separated by some time delay. The time delay can cause the electrode 412 closest to the first fluid opening 411 to be fully displaced away from the plates 130, 140 whereas the electrodes 412 in the centrally disposed pumps 410 are pressed against the plates 130, 140. The moving wave can move from the first fluid opening 411 towards the second fluid opening 419. Accordingly, the pumps 410 can be peristaltic pumps. However, any appropriate pumping mechanism can be employed in alternative embodiments.

The fluid control devices can include, in alternative embodiments, a combination of features. The following describes an exemplary embodiment where the fluid control devices 500 can be comprised of more than one selectively formed channel.

Figure 14:
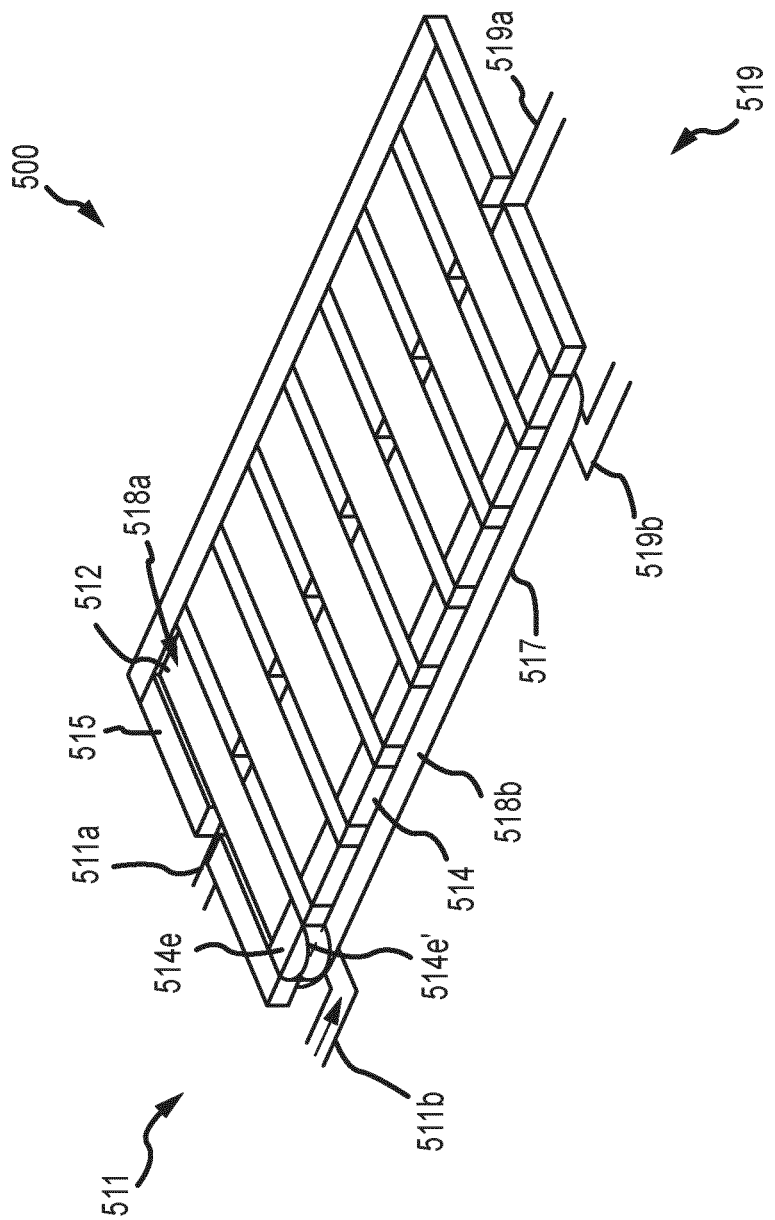
FIG. 14 shows a perspective view of fluid control devices 500 according to another embodiment.

FIG. 14 shows a perspective view of fluid control devices 500 according to another embodiment. The fluid control devices 500 include pumps 510 that are linearly arranged between the fluid paths 127, 128. The fluid control devices 500 are fluidly coupled to the fluid paths 127, 128 via the first fluid opening 511 and the second fluid opening 519. The first fluid opening 511 is comprised of a first channel opening 511a and a second channel 511b. The second fluid opening 519 is comprised of a first channel opening 519a and a second channel opening 519b. The fluid control devices 500 are rectangular shaped. In addition, a selectively formed channel is comprised of a first selectively formed channel 518a and a second selectively formed channel 518b. The first selectively formed channel 518a is formed between the electrodes 512 and the plates 130, 140. The second selectively formed channel 518b is formed between extending portions 514e and an adjacent surface 517.

The first and second selectively formed channels 518a, 518b can be synchronized. For example, the first selectively formed channel 518a can be formed between the electrode 512 and the first plate 130. When the electrode 512 displaces away from the first plate 130, the extending portion 514e' extends into the second selectively formed channel 518b.

When the electrode 512 is displaced towards the first plate 130, the extending portion 514e displaces away from the adjacent surface 517. The extending portions 514e can form moving wave shapes. In addition, the electrode 512 can displace away from the first plate 130 in a sequence that forms the moving wave shapes similar to those described with reference to FIGS. 10-13. The moving wave shapes in the first and second selectively formed channels 518a, 518b can be formed by actuating the electrodes 512 in a sequence.

With reference to the embodiments described in the foregoing, the conductors 152 are adapted to supply a voltage to the electrodes 212-512. The electrodes 212-512 and/or conductors 152 can be comprised of a copper alloy with a dielectric coating that prevents the voltage in the electrodes 212-512 from discharging to the fluid. The electrodes 212-512 can be coupled to a controller or other voltage source that controls the voltage that is applied to the electrodes 212-512. The voltage can be controlled to change or vary the width of the selectively formed channels 218-518. Accordingly, the fluid flow through the electroactive material fluid control apparatus 100 can be controlled by the fluid control devices 200-500.

The fluid control devices 200-500 can have substantially the same design. For example, in the fluid control devices 200 described with reference to FIG. 3-6b, the pumps 210, reservoirs 220, and valves 230 all have circular shaped electrodes 212-232 and dielectric deformable materials 214-234. The selectively formed channels 218 are between the electrodes 212 and the plates 130, 140. In the fluid control devices 300 described with reference to FIGS. 7-10c, the pumps 310, reservoir 320, and valve 330 have rectangular shaped electrodes and dielectric deformable material. In addition, the fluid control devices 300 have the extending portions 314e-334e that extend to reduce the width of the selectively formed channel 318. The casings 315-335 partially surround the dielectric deformable materials. In the fluid control devices 400 described with reference to FIGS. 11-13, the electrodes 412-432 are rectangular shaped and are attached to the surfaces of the dielectric deformable material 414-434. However, the fluid control devices 400 do not have casings. In addition, the selective formed channels 418-438 can be between the first plate 130 and the electrodes 412-432. More than one selectively formed channel 518a, 518b can be formed by the actuating the electrode 512. For example, actuating the electrode 512 in the embodiment described with reference to FIG. 14, can form the first selectively formed channel 518. De-actuating the electrode 512 can form the second selectively formed channel 518b by displacing the extending portion 514e away from the adjacent surface 517.

In operation, the electroactive material fluid control apparatus 100 can receive fluid at either of the first fluid ports 130a,b. For example, a first fluid can be provided to one of the first fluid ports 130a and a second fluid different than the first fluid can be provided to the other of the fluid ports 130b. The fluid can flow from the first fluid ports 130a,b into the fluid path 127 proximate the pumps 210-410. The fluid in the fluid path 127 can flow to the fluid control devices 200-400. In the embodiments described in the foregoing, the fluid control devices 200-400 are comprised of linearly arranged pumps 210-410, reservoirs 220-420, and valves 230-430. As shown, the fluid path 127 is fluidly coupled to the pumps 210-410.

As described in the foregoing, the pumps 210-410 can be peristaltic pumps that actuate with a moving wave shape to pump fluid. In some embodiments, the pumps 210-410 can actuated in a sequence that forms the moving wave in the selectively formed channels 218-418. For example, the pumps 310 described with reference to FIG. 7 can be actuated in a sequence such that the extending portions 314e extend into the selectively formed channel 318 to form the moving wave. The pumps 410 described with reference to FIGS. 12 and 13 can be actuated in sequence such that the electrodes 412 displace away from the first plate 130 to form the moving wave. An exemplary moving wave shape is shown in FIG. 13. Accordingly, the fluids in the fluid path 127 can be pumped into the reservoir 420. The reservoir 420 can receive and hold the fluid.

The valves 230-430 can regulate the flow of the fluid from the first fluid ports 130a,b to the second fluid port 130c. For example, in the fluid control devices 200 described with reference to FIGS. 3-6b, selectively formed channels 238 can be formed between the plates 130, 140 and the electrodes 212. In the fluid control devices 300 described with reference to FIGS. 7-10c, the selectively formed channels 338 can be formed between the extending portion 334e and the adjacent surface 337. The selectively formed channels can therefore regulate the flow of the fluids through the electroactive material fluid control apparatus 100.

The fluid can flow through the electroactive material fluid control apparatus 100 via the fluid paths 127, 128 and the fluid control devices 200-500. For example, the fluid can flow from the first fluid ports 130a,b to the fluid control devices 200-500 via the fluid paths 127a,b. The fluid can flow from the fluid control devices 200-400 to the second fluid port 130c via the fluid paths 128a-c. The fluid paths 127, 128 and the fluid control devices 200-500 can be in the dielectric layer 120. For example, the fluid paths 127, 128 or the fluid control devices 200-400 can be wholly contained in the dielectric layer 120. The fluid paths 127, 128 can also be formed by the plates 130, 140 and the dielectric layer 120. A portion of the fluid paths 127, 128 can also include portions of the fluid control devices 200-500 and/or devices or features in the plates 130, 140.

The embodiments described above provide an electroactive material fluid control apparatus 100. As explain above, the electroactive material fluid control apparatus 100 may regulate the flow of fluid using an dielectric layer 120. The fluid control devices 200-500 can be disposed in the dielectric layer 120. The fluid control devices 200-500 can also have similar designs. The fluid control devices 200-500 being formed in the dielectric layer 120 and the similar designs of the fluid control devices can result in relatively inexpensive manufacturing costs. For example, the costs associated with forming the electrodes 212-512 can be minimized by employing a single etch step for a layer of electrodes 212-512 (and the conductors 152) rather than multiple layers of electrodes and conductors. Similarly, the fluid paths 127-128 can be formed in a single substrate 122 rather than a plurality of substrates as the prior art fluid control devices typically employ.

Additionally, the electroactive material fluid control apparatus 100, being formed with a layered assembly 110 with as few as three layers comprised of the dielectric layer 120 and the plates 130, 140, can be assembled into an array of electroactive material fluid control apparatuses 100. For example, a plurality of the electroactive material fluid control apparatuss 100 can have a flat profile that is easily assembled into a segmented array. By adding more electroactive material fluid control apparatus 100 to the array, the electroactive material fluid control apparatus 100 can be scaled.

The electroactive material fluid control apparatus 100 can also be more reliable than complex assemblies found in the prior art. For example, the fluid control devices 200-500 can be comprised of electrodes 212-512 that are attached to dielectric deformable materials 234-514. The selectively formed channels 218-518b can be between the plates 130, 140, the electrodes 234-512 and the dielectric deformable material 234-514. In other words, a valve member that is a separate piece from the actuator is not required. In addition, the fluid flow can be controlled by increasing or decreasing the voltage on the electrodes 212-512 which increases or decreases the cross sectional area of the selectively formed channels. Therefore, the electroactive material fluid control apparatus 100 is inexpensive, scalable, and reliable.

The detailed descriptions of the above embodiments are not exhaustive descriptions of all embodiments contemplated by the inventors to be within the scope of the present description. Indeed, persons skilled in the art will recognize that certain elements of the above-described embodiments may variously be combined or eliminated to create further embodiments, and such further embodiments fall within the scope and teachings of the present description. It will also be apparent to those of ordinary skill in the art that the above-described embodiments may be combined in whole or in part to create additional embodiments within the scope and teachings of the present description.

Thus, although specific embodiments are described herein for illustrative purposes, various equivalent modifications are possible within the scope of the present description, as those skilled in the relevant art will recognize. The teachings provided herein can be applied to other electroactive material fluid control apparatus, and not just to the embodiments described above and shown in the accompanying figures. Accordingly, the scope of the embodiments described above should be determined from the following claims.

I claim:

1. A method of forming an electroactive material fluid control apparatus (100), comprising:
   forming a layered assembly (110) comprised of forming and disposing a dielectric layer (120) between a first plate (130) and a second plate (140);
   forming a first fluid port (130a, 130b) in an outer surface of the layered assembly (110);
   forming at least one fluid control device (200, 300, 400, 500) comprised of forming and disposing an electrode (212-512) between the first plate (130) and a dielectric deformable material (214-514), and attaching the electrode (212-512) to the dielectric deformable material (214-514), wherein the dielectric deformable material (214-514) is configured to contract in a direction that is perpendicular to a plane formed by the dielectric layer to displace the electrode away from the first plate when exposed to an electric field from the electrode such that a selectively formed channel (238, 338) is formed by the dielectric layer (120) and the first plate (130);
   forming a fluid path (127, 128) in the dielectric layer (120);
   forming a connector (150) that extends away from the layered assembly (110) in a direction substantially parallel to the dielectric layer (120); and
   fluidly coupling the fluid control device (200, 300, 400, 500) to the first fluid port (130a,b) via the fluid path (127, 128) in the dielectric layer (120) and coupling the electrode (212-512) to the connector (150).

2. The method of forming the electroactive material fluid control apparatus (100) of claim 1, further comprising forming a second fluid control device (200, 300, 400, 500) in the dielectric layer (120) and fluidly coupling the second fluid control device (200, 300, 400, 500) to the first fluid control device (200, 300, 400, 500) via the fluid path (127, 128).

3. The method of forming the electroactive material fluid control apparatus (100) of claim 1, further comprising forming the fluid path (127, 128) with the first plate (130), the dielectric layer (120), and the second plate (140).

4. The method of forming the electroactive material fluid control apparatus (100) of claim 1, wherein the selectively formed channel (238, 338, 518*b*) is formed by the dielectric layer (120), the first plate (130), and the second plate (140).

5. The method of forming the electroactive material fluid control apparatus (100) of claim 1, further comprised of opening the selectively formed channel (238, 518*a*) in the fluid control device (200, 500) by displacing the electrode (232, 512) away from the first plate (130).

6. The method of forming the electroactive material fluid control apparatus (100) of claim 1, wherein the selectively formed channel (338) in the fluid control device (300) closes when the dielectric deformable material (334) presses against an adjacent surface (337) in the dielectric layer (120).

7. The method of forming the electroactive material fluid control apparatus (100) of claim 1, further comprised of forming a valve (330) in the fluid control devices (300) comprised of:
   forming a casing (335) partially surrounding the dielectric deformable material (334);
   forming an extending portion (334*e*) of the dielectric deformable material (334); and
   forming the selectively formed channel (338) between the extending portion (334*e*) and an adjacent surface (337) of the dielectric layer (120).

8. The method of forming the electroactive material fluid control apparatus (100) of claim 1, further comprised of forming a valve (230) by forming a valve chamber (236*a,b*) partially surrounding the dielectric deformable material (234).

9. The method of forming the electroactive material fluid control apparatus (100) of claim 1, further comprising forming and coupling a second fluid port (130*c*) to the first fluid port (130*a*, 130*b*) via the fluid path (127, 128) in the dielectric layer (120).

10. A method of controlling a fluid flow in an electroactive material fluid control apparatus (100), the method comprising:
    providing a layered assembly (110) comprised of a dielectric layer (120) disposed between a first plate (130) and a second plate (140);
    providing a first fluid port (130*a*, 130*b*) formed in an outer surface of the layered assembly (110);
    providing a connector (150) that extends away from the layered assembly (110) in a direction parallel to the dielectric layer (120), wherein the connector (150) is coupled to an electrode (212-512) in the dielectric layer (120);
    flowing the fluid between the first fluid port (130*a*, 130*b*) and one or more fluid control devices (200, 300, 400, 500) via a fluid path (127, 128) in the dielectric layer (120) by applying a voltage to the electrode (212-512) with the connector (150), wherein the one or more fluid control devices (200, 300, 400, 500) is comprised of the electrode (212-512) disposed between the first plate (130) and a dielectric deformable material (214-514), the dielectric deformable material (214-514) being configured to contract in a direction that is perpendicular to a plane formed by the dielectric layer to displace the electrode away from the first plate when exposed to an electric field from the electrode, wherein the electrode (212-512) is attached to the dielectric deformable material (214-514),
    providing a selectively formed channel (418, 518*a*) in the fluid path (127, 128) formed by the dielectric layer (120) and the first plate (130) and opening the selectively formed channel (418, 518*a*) by displacing the electrode (212, 432) away from the first plate (130).

11. An electroactive material fluid control apparatus (100), comprising:
    a layered assembly (110) comprised of a dielectric layer (120) disposed between a first plate (130) and a second plate (140);
    a first fluid port (130*a*, 130*b*) formed in an outer surface of the layered assembly (110); and
    at least one fluid control device (200, 300, 400, 500) comprised of an electrode (212-512) disposed between the first plate (130) and a dielectric deformable material (214-514), wherein the electrode (212-512) is attached to the dielectric deformable material (214-514), wherein the dielectric deformable material (214-514) is configured to contract in a direction that is perpendicular to a plane formed by the dielectric layer to displace the electrode away from the first plate when exposed to an electric field from the electrode;
    wherein the at least one fluid control device (200, 300, 400, 500) is fluidly coupled to the first fluid port (130*a*, 130*b*) via a fluid path (127, 128) in the dielectric layer (120) and the electrode (212-512) is coupled to a connector (150) that extends away from the layered assembly (110) in a direction parallel to the dielectric layer (120); and
    wherein the fluid control device (200, 300,) is comprised of a selectively formed channel (238, 338) formed by the dielectric layer (120) and the first plate (130) when the electrode (212-332) displaces away from the first plate (130).

12. The electroactive material fluid control apparatus (100) of claim 1, further comprising a second fluid control device (200, 300, 400, 500) in the dielectric layer (120) and fluidly coupled to the first fluid control device (200, 300, 400, 500) via the fluid path (127, 128).

13. The electroactive material fluid control apparatus (100) of claim 1, wherein the fluid path (127, 128) is formed by the first plate (130), the dielectric layer (120), and the second plate (140).

14. The electroactive material fluid control apparatus (100) of claim 1, further comprising a second electrode (212-332) between the dielectric deformable material (214-334) and the second plate (140), wherein the selectively formed channel (238, 338) is formed by the dielectric layer (120), the first plate (130), and the second plate (140) when the first and second electrodes (212-332) displace away from the first and second plates (130, 140).

15. The electroactive material fluid control apparatus (100) of claim 1, wherein the selectively formed channel (338, 518*b*) is closed when the dielectric deformable material (334, 534) presses against an adjacent surface (337, 517) in the dielectric layer (120).

16. The electroactive material fluid control apparatus (100) of claim 1, wherein the fluid control device (300) is a valve (330) comprised of:
    a casing (335) partially surrounding the dielectric deformable material (334);
    an extending portion (334*e*) of the dielectric deformable material (334); and the selectively formed channel (338), wherein the selectively formed channel (338) is between the extending portion (334e) and an adjacent surface (337) of the dielectric layer (120).

17. The electroactive material fluid control apparatus (100) of claim 1, wherein the fluid control device (200) is a valve (230) further comprised of a valve chamber (236a,b) partially surrounding the dielectric deformable material (234).

18. The electroactive material fluid control apparatus (100) of claim 1, further comprising a second fluid port (130c) fluidly coupled to the first fluid port (130a, 130b) via the fluid path (127, 128) in the dielectric layer (120).

* * * * *